United States Patent
Mohapatra et al.

(10) Patent No.: US 10,529,808 B2
(45) Date of Patent: Jan. 7, 2020

(54) DOPANT DIFFUSION BARRIER FOR SOURCE/DRAIN TO CURB DOPANT ATOM DIFFUSION

(71) Applicant: Intel Corporation, Santa Clara, CA (US)

(72) Inventors: Chandra S. Mohapatra, Hillsboro, OR (US); Harold W. Kennel, Portland, OR (US); Glenn A. Glass, Portland, OR (US); Will Rachmady, Beaverton, OR (US); Gilbert Dewey, Beaverton, OR (US); Jack T. Kavalieros, Portland, OR (US); Anand S. Murthy, Portland, OR (US); Tahir Ghani, Portland, OR (US); Matthew V. Metz, Portland, OR (US); Sean T. Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/072,313

(22) PCT Filed: Apr. 1, 2016

(86) PCT No.: PCT/US2016/025726
§ 371 (c)(1),
(2) Date: Jul. 24, 2018

(87) PCT Pub. No.: WO2017/171873
PCT Pub. Date: Oct. 5, 2017

(65) Prior Publication Data
US 2019/0035897 A1    Jan. 31, 2019

(51) Int. Cl.
*H01L 29/417* (2006.01)
*H01L 29/205* (2006.01)
(Continued)

(52) U.S. Cl.
CPC ........ *H01L 29/205* (2013.01); *H01L 29/1033* (2013.01); *H01L 29/6681* (2013.01);
(Continued)

(58) Field of Classification Search
None
See application file for complete search history.

(56) References Cited

U.S. PATENT DOCUMENTS

| | | | | |
|---|---|---|---|---|
| 5,591,994 A | * | 1/1997 | Hara | H01L 29/0891 257/192 |
| 6,706,542 B1 | * | 3/2004 | Geva | H01L 21/2205 257/E21.136 |

(Continued)

FOREIGN PATENT DOCUMENTS

JP    2014-239201    12/2014

OTHER PUBLICATIONS

International Search Report and Written Opinion for International Patent Application No. PCT/US2016/025726 dated Dec. 28, 2016, 12 pgs.

(Continued)

*Primary Examiner* — Benjamin P Sandvik
(74) *Attorney, Agent, or Firm* — Schwabe, Williamson & Wyatt, P.C.

(57) ABSTRACT

An apparatus including a transistor device on a substrate including an intrinsic layer including a channel; a source and a drain on opposite sides of the channel; and a diffusion barrier between the intrinsic layer and each of the source and the drain, the diffusion barrier including a conduction band energy that is less than a conduction band energy of the channel and greater than a material of the source and drain. A method including defining an area of an intrinsic layer on a substrate for a channel of a transistor device; forming a diffusion barrier layer in an area defined for a source and a (Continued)

drain; and forming a source on the diffusion barrier layer in the area defined for the source and forming a drain in the area defined for the drain.

21 Claims, 11 Drawing Sheets

(51) Int. Cl.
  *H01L 29/10* (2006.01)
  *H01L 29/66* (2006.01)
  *H01L 29/78* (2006.01)

(52) U.S. Cl.
  CPC .. *H01L 29/66522* (2013.01); *H01L 29/66545* (2013.01); *H01L 29/7851* (2013.01)

(56) References Cited

U.S. PATENT DOCUMENTS

| | | | |
|---|---|---|---|
| 9,264,998 | B2 | 2/2016 | Takeuchi et al. |
| 9,917,195 | B2* | 3/2018 | Cai ................... H01L 29/66795 |
| 2007/0164322 | A1 | 7/2007 | Smith et al. |
| 2010/0059764 | A1 | 3/2010 | Luo et al. |
| 2011/0211402 | A1 | 9/2011 | Rakshit et al. |
| 2014/0145243 | A1 | 5/2014 | Beam, III et al. |
| 2015/0162405 | A1* | 6/2015 | Yang ................... H01L 29/1045 257/76 |
| 2017/0047404 | A1* | 2/2017 | Bentley ............... H01L 29/1054 |

OTHER PUBLICATIONS

International Preliminary Report on Patentability for International Patent Application No. PCT/US2016/025726 dated Oct. 11, 2018, 9 pages.

* cited by examiner

DOPANT DIFFUSION BARRIER FOR SOURCE/DRAIN TO CURB DOPANT ATOM DIFFUSION

CROSS-REFERENCE TO RELATED APPLICATION

This patent application is a U.S. National Phase Application under 35 U.S.C. § 371 of International Application No. PCT/US2016/025726, filed Apr. 1, 2016, entitled "DOPANT DIFFUSION BARRIER FOR SOURCE/DRAIN TO CURB DOPANT ATOM DIFFUSION," which designates the United States of America, the entire disclosure of which is hereby incorporated by reference in its entirety and for all purposes.

BACKGROUND

Field

Integrated circuit devices.

Description of Related Art

Epitaxial growth of group III-V compound semiconductor materials on silicon is one path for adopting group III-V compound semiconductor materials in semiconductor manufacturing. Silicon being an amphoteric donor in most group III-V compound semiconductor materials is used as a preferred dopant for source/drain applications. Silicon serves as an amphoteric donor doping the material n-type. Because of the various thermal temperature transitions associated with various processes in the semiconductor manufacturing assembly line, silicon atoms from the source/drain can thermally diffuse into a channel and eventually into the sub-fin of a typical group III-V compound semiconductor trigate transistor. If group III-V compound semiconductor is used for PMOS transistors, having an n-type doped sub-fin may be desirable. But, in the NMOS case, having an unintentionally doped n-type sub-fin could create an electrical short between the source/drain leading to high sub-fin leakage, and it would be difficult to turn the transistor off.

DETAILED DESCRIPTION

Techniques to reduce diffusion of dopant atoms from a source or a drain of a transistor device to an intrinsic layer and/or sub-intrinsic layer are described. In one embodiment, dopant diffusion is reduced by the placement of a diffusion barrier between the intrinsic layer and the source and the drain. In one embodiment, the diffusion barrier has a similar lattice constant as the source and drain material and provides a positive conduction band offset (CBO) with respect to a channel in the intrinsic layer without introducing an external resistance penalty.

Figure 1:
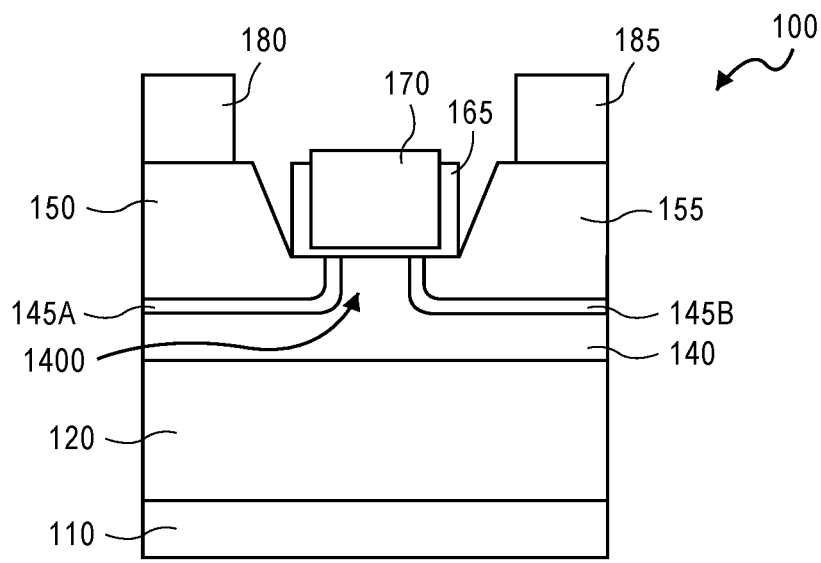
FIG. 1 shows a cross-sectional schematic side view of an embodiment of a field effect transistor (FET) device including a multilayer source and drain.

FIG. 1 shows a cross-sectional side view of an embodiment of a field effect transistor (FET) device such as N-type metal oxide semiconductor FET (MOSFET). Referring to FIG. 1, device 100 includes substrate 110 that is, for example, a single crystal silicon substrate. Disposed on substrate 110, in this embodiment, is buffer layer 120. Buffer layer 120 includes, for example, a material that is a high band gap material that has a positive conduction band offset (CBO) of more than 0.2 electron-volts (eV) with respect to a channel material of a device formed on buffer layer 120. Examples of a suitable material for buffer layer 120 include, but are not limited to, gallium arsenide (GaAs), indium aluminum arsenide (InAlAs), gallium antimony (GaSb), indium phosphide (InP), indium aluminum phosphide (InAlP) and gallium aluminum antimony (GaAlSb). A representative thickness of buffer layer 120 is on the order of 150 nanometers (nm) to 250 nm. In one embodiment, buffer layer 120 may be one selected material. In another embodiment, buffer layer 120 may be multiple materials such as multiple materials in a stacked arrangement (e.g., a first buffer material disposed closer to substrate 110 than a second buffer material). Where buffer layer 120 is formed in a trench patterned in substrate 110 as described below, buffer layer 120 could also have a nucleation layer to wet a trench bottom that could be V-shaped (e.g., a {111} faceting). Such a nucleation layer is a high band gap material such as identified as suitable for buffer layer 120 that is grown at a relatively low temperature (e.g., 200° C. to 400° C.) in order to wet a trench bottom. A representative thickness of a nucleation layer is 20 nm to 40 nm.

As illustrated in FIG. 1, disposed on buffer layer 120 is intrinsic layer 140. Intrinsic layer 140, in one embodiment, is a group III-V compound semiconductor material such as but not limited to indium gallium arsenide (InGaAs), indium phosphide (InP), indium arsenide (InAs), and indium gallium antimony (InGaSb). Intrinsic layer 140, in one embodiment, is selected of a material desired for a channel of the transistor device as the intrinsic layer will include the channel of the device.

Formed in intrinsic layer 140 is junction region or source 150 and junction region or drain 155. In one embodiment, source 150 is an n+ source of an NMOSFET and drain 155 is an n+ drain. In one embodiment, each of source 150 and drain 155 are a group III-V compound semiconductor material. Representative examples of a group III-V compound semiconductor material for an NMOSFET include but are not limited to indium arsenide (InAs), indium antimony (InSb), and InGaAs. Disposed between source 150 and drain 155 is channel 1400 of intrinsic layer 140. In one embodiment, channel 1400 is undoped (electrically neutral or doped with less than 5E17 carriers of either type). Overlying channel 1400 is gate dielectric layer 165 of, for example, a silicon dioxide or a dielectric material having a dielectric constant greater than silicon dioxide (a high k material) or a combination of silicon dioxide and high k material or multiple high k materials. Disposed on gate dielectric layer 165 is gate electrode 170 of, for example, a metal material (e.g., tungsten, tantalum) or a metal compound (e.g., a silicide). FIG. 1 also shows contact 180 to source 150 and contact 185 to drain 155 each of a metal material such as nickel (Ni), cobalt (Co), titanium (Ti) and their silicides.

As illustrated in FIG. 1, each of source 150 and drain 155 is disposed on a diffusion barrier layer. FIG. 1 shows diffusion barrier layer 145A between intrinsic layer 140 and source 150 and diffusion barrier layer 145B between intrinsic layer 140 and drain 155. In one embodiment, each of diffusion barrier layer 145A and diffusion barrier layer 145B is a similar material that inhibits diffusion of dopants from the source and drain (e.g., silicon dopants) into intrinsic layer 140 and/or blocking layer 130 and provides a conduction band energy that is less than a conduction band energy of a material of channel 1400 and higher than a conduction band energy of the source and drain material. Representatively, a material of diffusion barrier layer 145A and of diffusion barrier layer 145B has a similar lattice constant as the source and drain material and will create a positive conduction band offset (CBO) with respect to a material of source 150 and drain 155 without introducing an external resistance penalty. Where intrinsic layer 140 (and channel 1400) is a group III-V compound semiconductor material, diffusion barrier layer 145A and diffusion barrier layer 145B is also a group III-V semiconductor material such as a dilute nitride alloy of a material of intrinsic layer 140 where a dilute nitride alloy is an alloy with a low atomic percentage of nitrogen (e.g., one to five percent) in the crystal lattice. Where intrinsic layer 140 is InGaAs, for example, a material of each of diffusion barrier layer 145A and diffusion barrier layer 145B is a nitride alloy of InGaAs. In one embodiment, the nitride alloy has the formula $InGaAs_{1-y}$, wherein y is less than 0.03. Nitride alloys of other suitable intrinsic materials include but are not limited to dilute nitride alloys of indium phosphide (e.g., InPN), indium arsenide (InAsN) and indium gallium antimony (e.g., InGaSbN). Any lattice mismatch between a nitride alloy material of a diffusion barrier layer and the intrinsic layer is resolved by forming (e.g., epitaxially growing) diffusion barrier layer 145A and diffusion barrier layer 145B as a pseudomorphic layer (lesser than its critical thickness) where it will conform to the underlying material.

Figure 2:
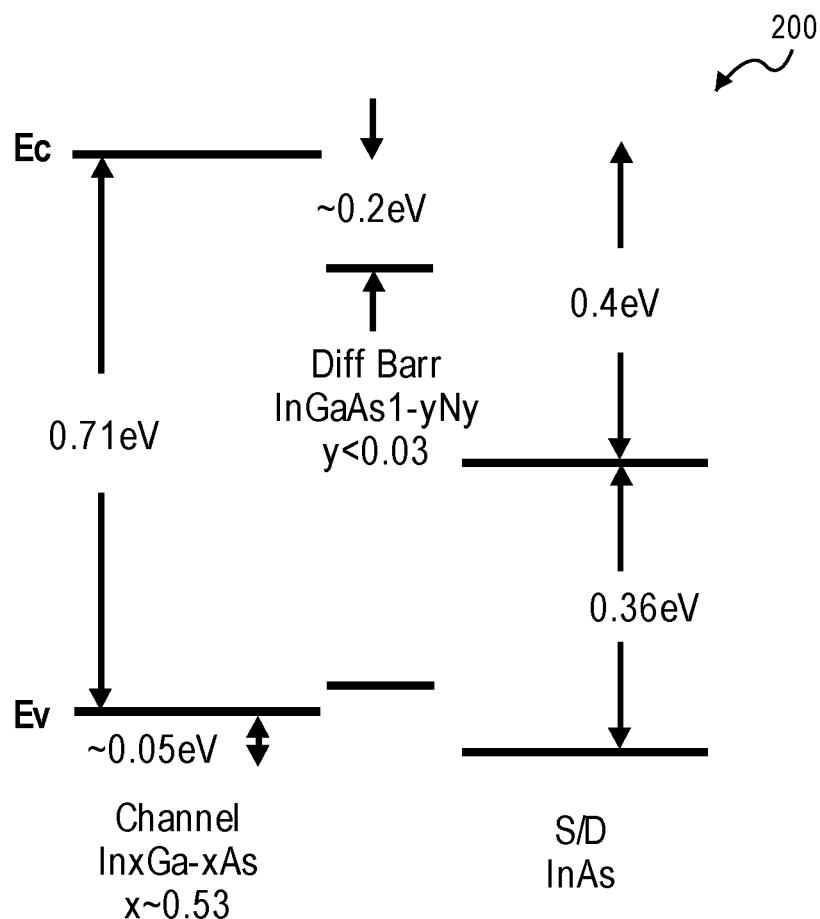
FIG. 2 shows a band diagram plotting energy levels of a channel material of indium gallium arsenide (InGaAs), a diffusion barrier layer material of $InGaAs_{1-y}N_y$ (y<0.03) and a source/drain of indium arsenide (InAs).

FIG. 2 shows a band diagram plotting energy levels of a channel material of InGaAs, a diffusion barrier layer material of $InGaAs_{1-y}N_y$ (y<0.03) and a source/drain of the materials. Band diagram 200 shows a band alignment of the materials relative to one another. In this example, the band gap of the diffusion barrier layer material lies between the band gap of the channel material and the band gap of the source/drain material. FIG. 2 shows that the diffusion barrier layer material has a conduction band energy ($E_c$) that is less than an $E_c$ of the channel material and that is higher than an $E_c$ of the source/drain material.

Having a pseudomorphic (lower than the critical thickness of the material) layer of InGaAs1-yNy (y<0.03) in the source/drain region before the actual heavily silicon doped source/drain material is grown is desired. The presence of nitrogen in $InGaAs_{1-y}N_y$ lowers its lattice parameter making it intermediate between InGaAs and InAs. This class of dilute nitrides has a band-gap lower than the typical InGaAs channel and higher than the typical InAs source/drain. The change in band-gap of the nitride alloy of InGaAs ($InGaAs_{1-y}N_y$ (y<0.03) relative to InGaAs itself is largely taken up as a conduction band offset (CBO) rather than as a valence band offset (VBO). With the diffusion barrier sandwiched between the InGaAs channel and InAs source/drain, this dilute nitride based alloy has the desired intermediate conduction band (CB) energy without incurring an external resistance penalty. Without wishing to be bound by theory, the dilute nitride alloy diffusion barrier ($InGaAs_{1-y}N_y$ (y<0.03) serves to trap dopant atoms (e.g., silicon atoms) in doped source/drain material by bonding to the N lone-pair of electrons in the dilute nitride alloy so that such atoms do not diffuse into the InGaAs channel or the blocking layer or sub-fin (GaAs sub-fin) due to subsequent thermal process steps associated with device manufacture.

Figure 3:
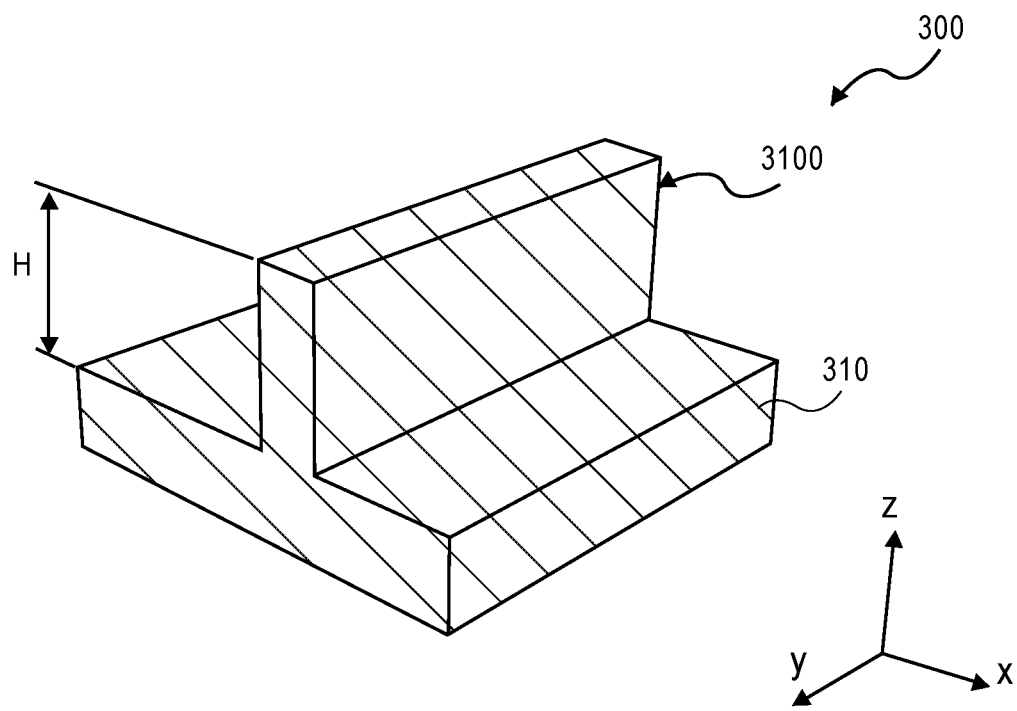
FIG. 3 shows a perspective side view of a substrate that may be any material that may serve as a foundation on which a multi-gate FET may be constructed, the substrate having a sacrificial fin formed therein.

FIGS. 3-12 describe a process for forming an FET such as illustrated in FIG. 1. FIG. 13 presents a flow chart of the process. FIGS. 3-12 describe a three-dimensional multi-gate FET including a diffusion barrier layer under each of the source and the drain. The concept of a diffusion barrier layer under source and drain can similarly be applied to planar transistor and gate all around transistors. Referring to FIG. 3 and with reference to the flow chart of FIG. 13, the process begins by defining sacrificial fin structures in a substrate material (block 410, FIG. 13). FIG. 3 shows a perspective side view of substrate 310 that may be any material that may serve as a foundation of which a multi-gate FET may be constructed. Representatively, substrate 310 is a portion of a larger substrate such as wafer. In one embodiment, substrate 310 is a semiconductor material such as single crystal silicon. Substrate 310 may be a bulk substrate or, in another embodiment, a semiconductor on insulator (SOI) structure. FIG. 3 shows substrate 310 following a patterning of the substrate to define sacrificial fin 3100. Sacrificial fin 3100 may be one of many sacrificial fins formed in the substrate. Sacrificial fin 3100 may be formed by a mask and etch process wherein a mask (e.g., a hard mask) is introduced on a surface (superior surface) of substrate 310 to protect areas of the substrate where the sacrificial fins will be defined and to provide openings in non-fin areas. Once the mask is patterned, substrate 310 may be etched to remove material in unprotected areas. A substrate of silicon may be etched with a wet or dry etch. Representatively, a suitable etchant is HF based chemistry. In one embodiment, sacrificial fin 3100 is etched to have a height, H, on the order of 100 nanometers (nm) to 400 nm.

Figure 4:
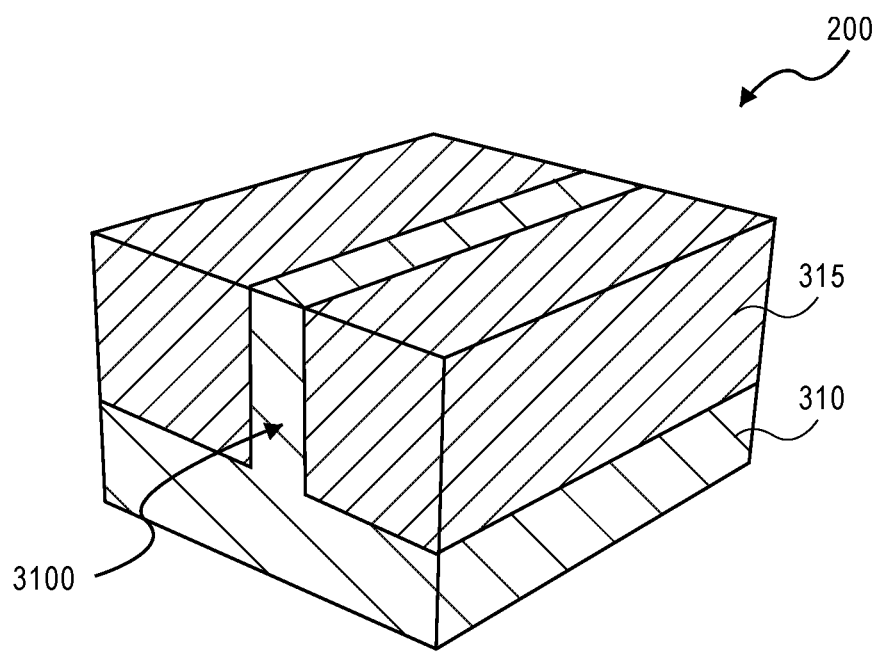
FIG. 4 shows the structure of FIG. 3 following a deposition of a trench dielectric layer on the substrate and planarized to a surface of the sacrificial fin.

FIG. 4 shows the structure of FIG. 3 following a removal of the mask on the fin and following the deposition of a trench dielectric layer on the substrate (block 415, FIG. 13). In one embodiment, dielectric layer 315 is silicon dioxide or a low-k dielectric material. Following deposition of dielectric layer 315, a surface of the structure (a superior surface as viewed) is polished to the level of the top of sacrificial fin 3100 so that the fin is exposed.

Figure 5:
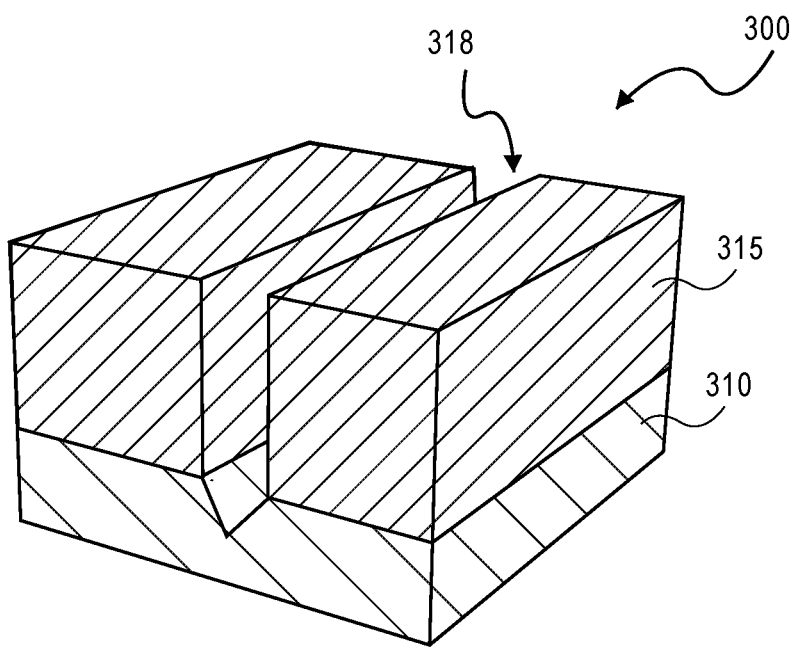
FIG. 5 shows the structure of FIG. 4 following the removal of the sacrificial fin to form a trench of a controlled size and shape.

FIG. 5 shows the structure of FIG. 4 following the removal of sacrificial fin 3100 to form a trench of a controlled size and shape (block 420, FIG. 13). The sacrificial fin may be removed by a mask and etch process wherein a mask is patterned on a surface of dielectric layer 315 leaving sacrificial fin 3100 exposed followed by an etch process to remove the fin. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fin forms trench 318. In one embodiment, the etching of the sacrificial fin may be performed to provide a {111} faceting at the bottom of trench 318 to facilitate a growth of a group III-V compound material in the trench which is done using TMAH-like or any equivalent chemistry. Alternative geometries are also contemplated.

Figure 6:
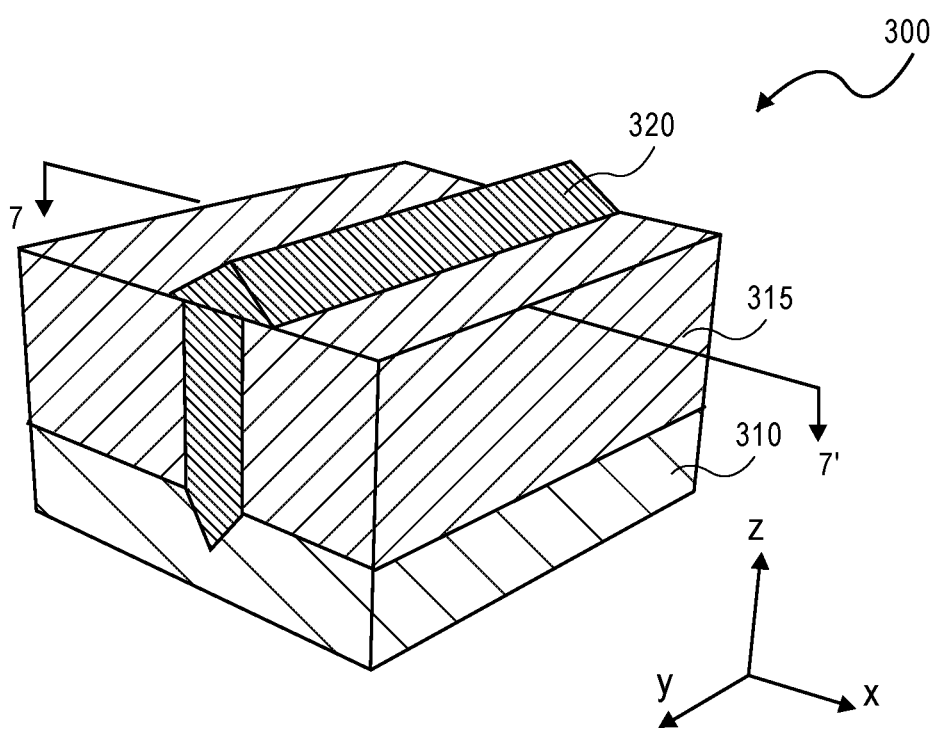
FIG. 6 shows the structure of FIG. 5 following the introduction of a buffer material in the trench.

FIG. 6 shows the structure of FIG. 5 following the introduction of a buffer material in trench 318 (block 422, FIG. 13). In one embodiment, buffer material 320 is a group III-V compound material such as, but not limited to, gallium arsenide (GaAs), indium phosphide (InP); germanium (Ge), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trenches may be filled with a first buffer material of one of the noted materials as, for example, a nucleation layer at a base of trench 318 followed by a second buffer material of another of the noted materials. The trench confined growth of a buffer material or materials offer an advantage of aspect ratio trapping (ART) whereby crystalline quality of the epitaxial layer(s) is enhanced through trapping of threading dislocations, stacking faults, twins, etc., at sidewalls of a trench where defects terminate such that overlying layers may be increasingly defect-free. FIG. 6 shows buffer material 320 in trench 318. The buffer material has a dimension measured in z direction on the order of 100 nm to 400 nm. FIG. 6 shows buffer material 320 including {111} faceted overgrowth protruding off the superior plane defined by dielectric layer 315.

Figure 7:
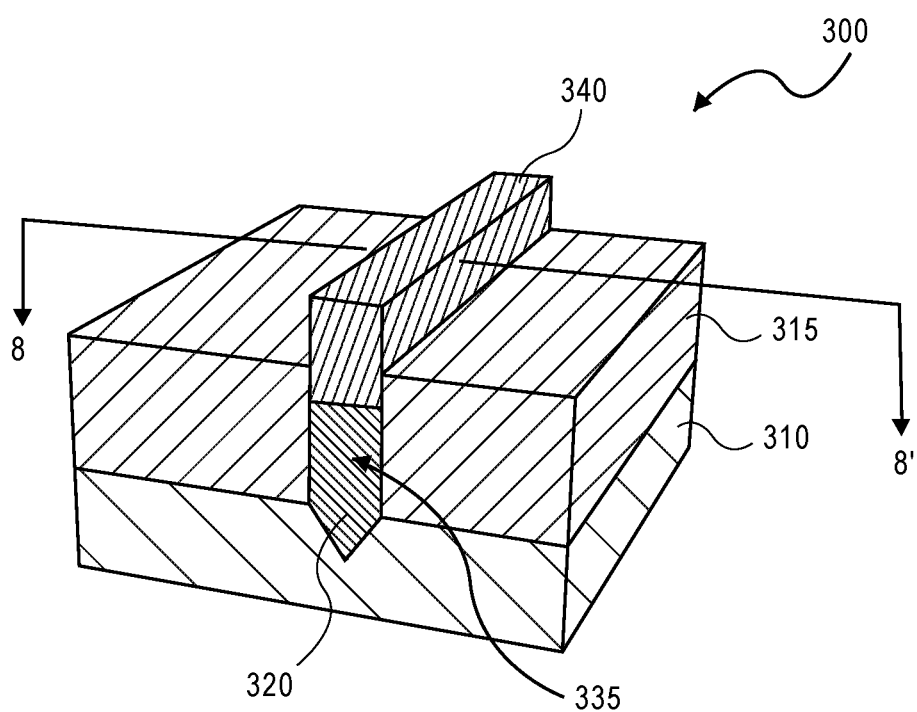
FIG. 7 shows the structure of FIG. 6 following a removal of a portion of the buffer material in the trench and the introduction of an intrinsic material into the trench.
Figure 8:
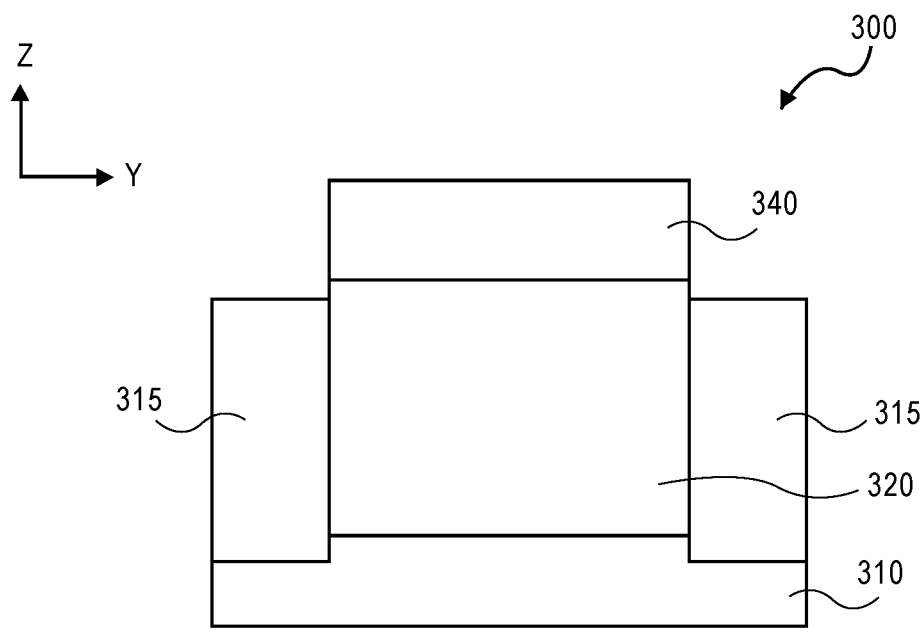
FIG. 8 shows a cross-sectional schematic side view of the structure of FIG. 7 through line 8-8'.

FIG. 7 shows the structure of FIG. 6 following a removal of a portion of buffer material 320 in trench 318 and the introduction of an intrinsic material into the trench. In one embodiment, the removal of buffer material 320 is performed by an etch to recess the buffer material in the trench (block 424, FIG. 13). In one embodiment, the removal of buffer material 320 is performed in a manner to create an inverse {111} facet. A suitable etchant for creating an inverse {111} faceted profile in buffer material 320 is TMAH or any equivalent chemistry. FIG. 7 shows intrinsic layer 340 formed on buffer material 320 (block 426, FIG. 13). The intrinsic layers may be epitaxially grown. In one embodiment, intrinsic layer 340 is an indium-containing group III-V compound material. In one embodiment, intrinsic layer 340 is InGaAs. Intrinsic layer 340 has a representative height on the order of 40 nm to 100 nm. FIG. 7 shows the structure following a polish of the intrinsic layer to a plane defined by dielectric layer 315 and after a recession of dielectric layer 315 such that the intrinsic layer is protruding above a plane defined by dielectric layer 315 as a fin structure (block 430, FIG. 13). FIG. 8 shows a cross-sectional side view of the structure of FIG. 7 through line 8-8'. A representative height of the exposed fin is representatively on the order of 500 angstroms (Å).

Figure 9:
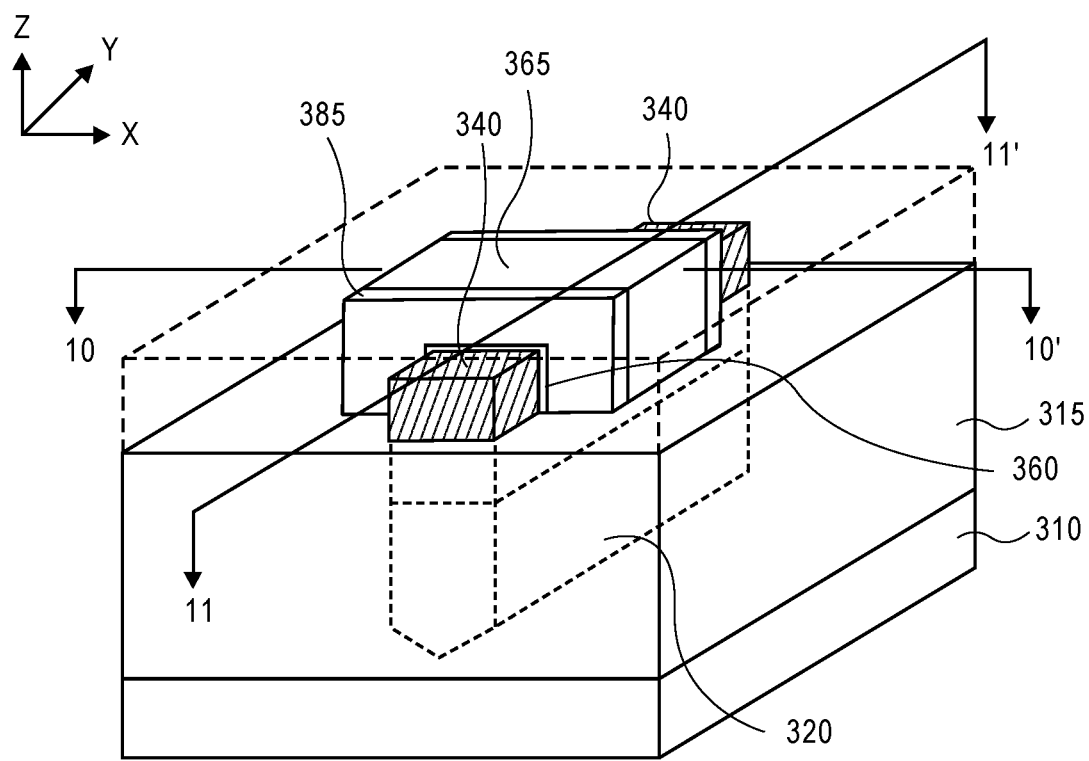
FIG. 9 shows a top side perspective view of the structure of FIG. 8 following the formation of a sacrificial or dummy gate stack on a fin portion of an intrinsic layer.

FIG. 9 shows a top side perspective view of the structure of FIG. 8 following the formation of a sacrificial or dummy gate stack on fin portion of intrinsic layer 340 extending above dielectric layer 315 (block 440, FIG. 13). In one embodiment, a gate stack includes gate dielectric layer 360 of, for example, silicon dioxide or a high k dielectric material. Disposed on gate dielectric layer 360, in one embodiment, is dummy gate 365 of, for example, polysilicon deposited by, for example, a chemical vapor deposition method. In one embodiment, prior to forming the gate stack, a dielectric layer of silicon dioxide or a low k material is introduced on the structure (shown in dashed lines). To form the gate stack, a mask material is introduced over the structure on the dielectric layer and patterned to have an opening for the gate stack. The gate stack is then introduced in the opening. The gate stack may include a spacer dielectric layer defining spacers 385 on opposite sides thereof.

Figure 10:
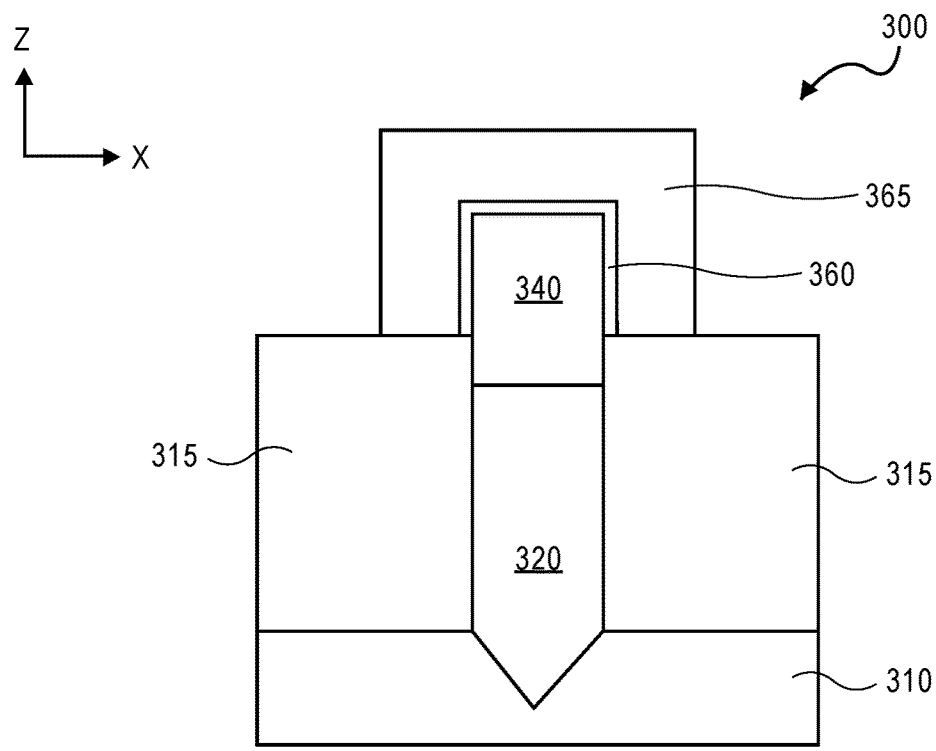
FIG. 10 shows the structure of FIG. 9 through line 10-10' showing the gate stack of the gate dielectric and dummy gate on the fin defined by the intrinsic layer.
Figure 11:
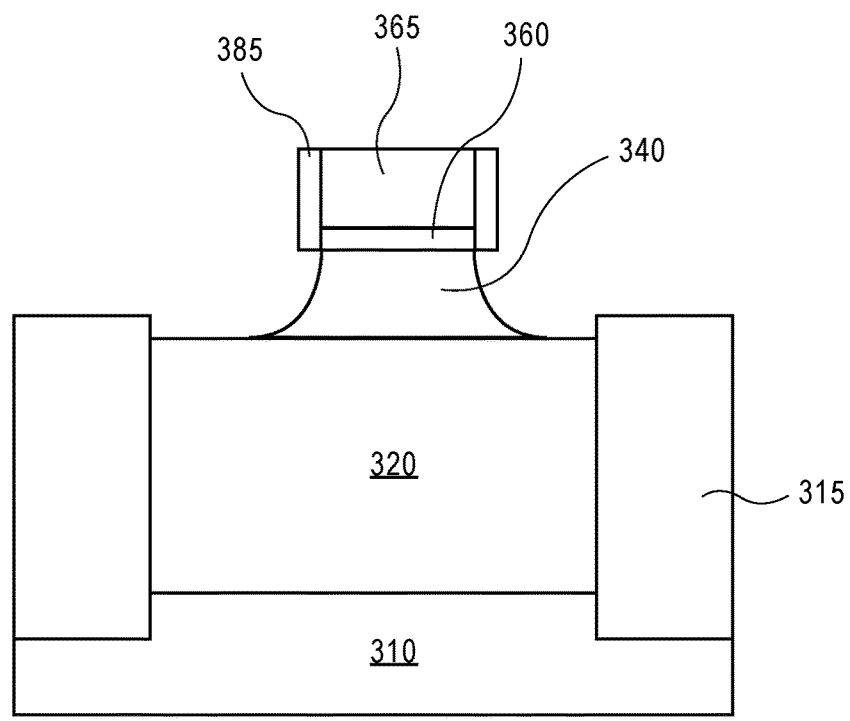
FIG. 11 shows a view of FIG. 9 through line 11-11' after removing portions of the intrinsic layer corresponding to source and drain regions in the fin.

FIG. 10 shows the structure of FIG. 9 through line 10-10' showing the gate stack of gate dielectric 360 and dummy gate 365 on the fin defined by intrinsic layer 340. FIG. 11 shows a view of FIG. 9 through line 11-11' after removing portions of intrinsic layer 340 corresponding to junction regions (source and drain) in the fin. Representatively, areas of the fin intrinsic layer 340 corresponding to the junction regions of the fin are exposed in the dielectric layer and an etch of the exposed areas is performed (an etch under-cut (EUC)) to remove intrinsic layer material leaving voids (block 450, FIG. 13).

Figure 12:
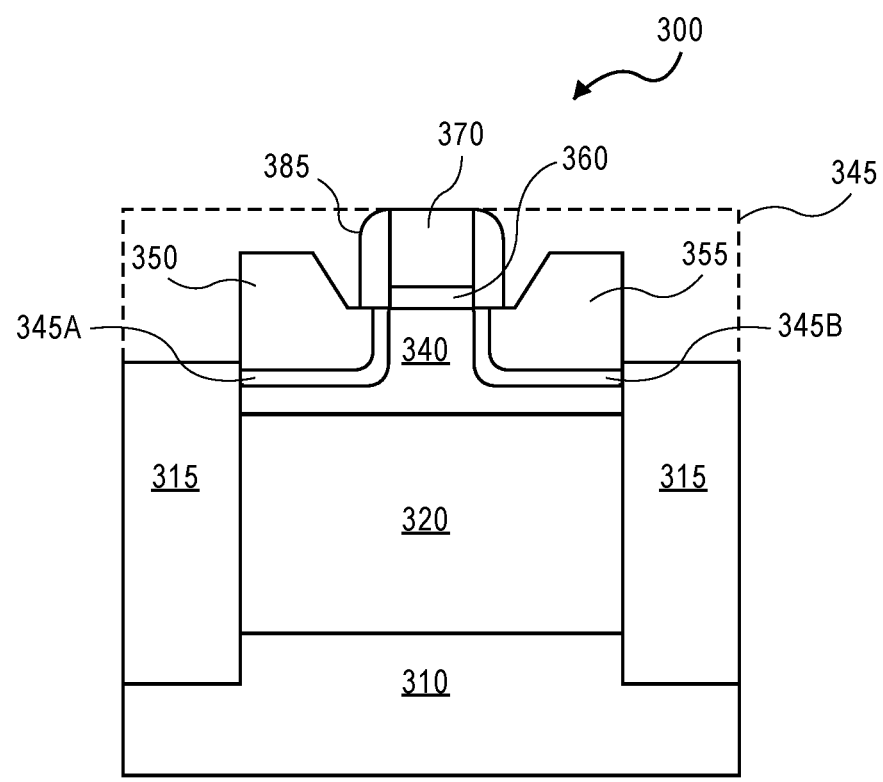
FIG. 12 shows the structure of FIG. 11 following the formation of a dopant diffusion barrier layer in each of the junctions designated for a source and a drain and following the formation of a source and a drain.
Figure 13:
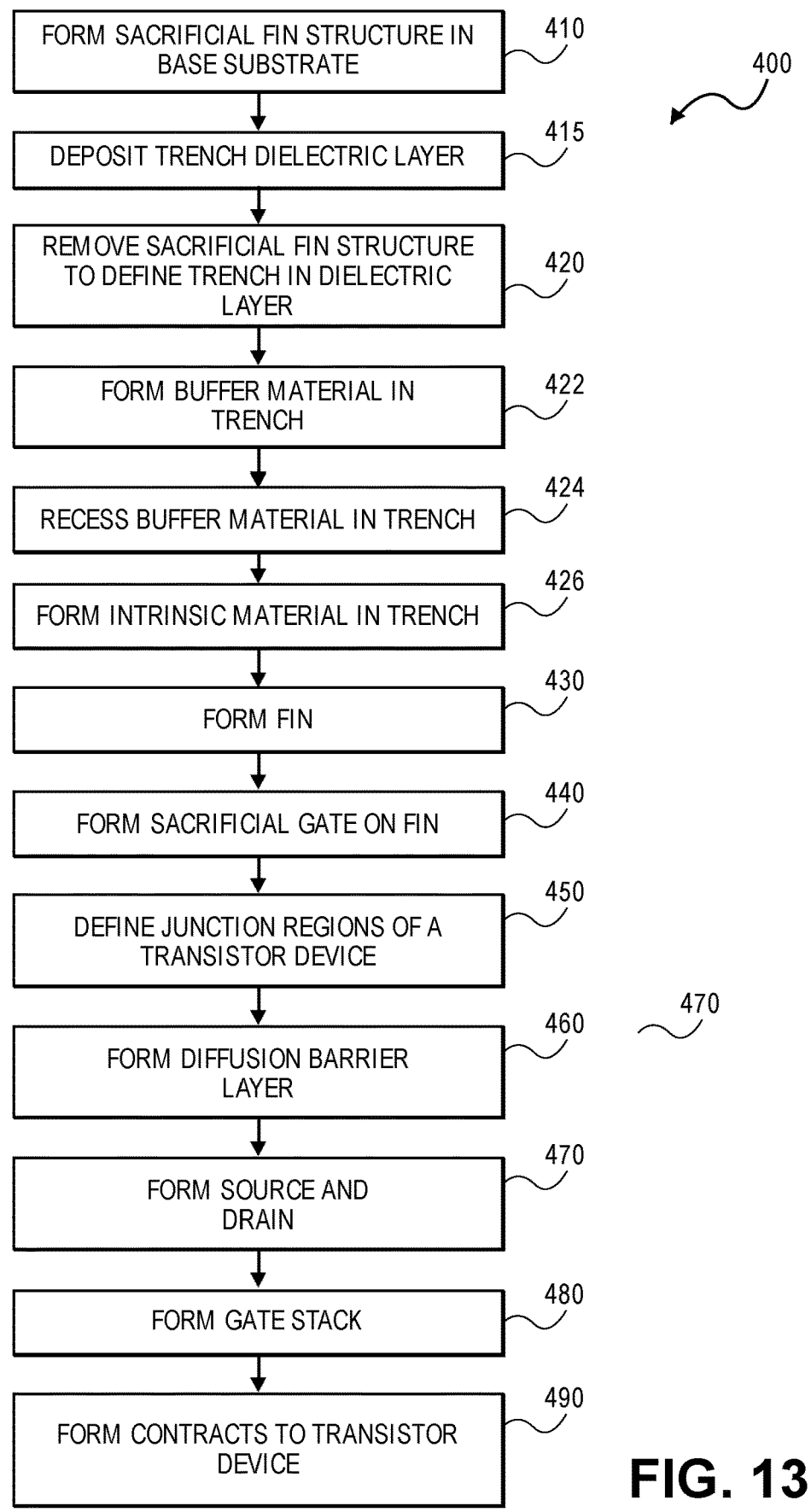
FIG. 13 presents a flow chart of an embodiment of a process of forming a three-dimensional transistor device with a multilayer or composite source and drain.

FIG. 12 shows the structure of FIG. 10 following the formation of a dopant diffusion barrier layer in each of the junction regions designated for a source and a drain (block 460, FIG. 13). In one embodiment, diffusion barrier layer 345A and diffusion barrier layer 345B are a material that inhibits a diffusion of dopants from a source/drain into intrinsic layer 335 and/or blocking layer 330 and has a CBO relative to a material of the channel (e.g., a material of intrinsic layer 335) where a conduction band energy of a material of diffusion barrier layer 345A and diffusion barrier layer 345B is less than a conduction band energy of a material of the channel_and more than the conduction band (CB) of source/drain. In one embodiment, a material of diffusion barrier layer 345A and diffusion barrier layer 345B is a nitride alloy of a material of intrinsic layer 335. Where intrinsic layer 335 is a group III-V compound semiconductor material, diffusion barrier layer 345A and diffusion barrier layer 345B is a nitride alloy of such material. For a material of intrinsic layer 335 of InGaAs, in one embodiment, a material of diffusion barrier layer 345A and diffusion barrier layer 345B is $InGaAs_{1-y}N_y$, wherein y is less than 0.03. In one embodiment, diffusion barrier layer 345A and diffusion barrier layer 345B of a nitride alloy of group III-V compound semiconductor is epitaxially grown and is pseudomorphic in the sense that it is thinner than a certain critical thickness above which stress in the layer is released by dislocation.

FIG. 12 also shows the structure of FIG. 11 following the formation of a source and a drain of the device (block 470, FIG. 13). Source 350 and drain 355, in one embodiment, are a silicon-doped group III-V compound material suitable for an NMOSFET. Examples include but are not limited to InAs, InSb and InGaAs. In one embodiment, a material for source 340 and drain 350 is epitaxial grown.

Following formation of source 350 and drain 355, a dielectric material is introduced on the structure (on a surface including junction regions 340 and 350 and sacrificial gate 365). In one embodiment, the dielectric material is silicon dioxide or a low k material or a combination of materials (e.g., multiple low k materials or silicon dioxide and one or more low k materials). FIG. 12 shows dielectric material in dashed lines. Sacrificial gate 365 and gate dielectric are then removed and replaced with a gate dielectric of silicon dioxide, a high-k material or a combination of silicon dioxide and a high-k material. This is followed by the introduction of a gate electrode such as a metal gate electrode (block 480, FIG. 13). This is a typical gate-last process flow. Representative materials for a metal gate electrode include tungsten, tantalum, titanium or a nitride, a metal allow or another material. Following formation of gate electrode 370, contacts may be made to source 340 and drain 350 (and gate electrode 370) to form the device shown in FIG. 1 (block 490, FIG. 8).

Figure 14:
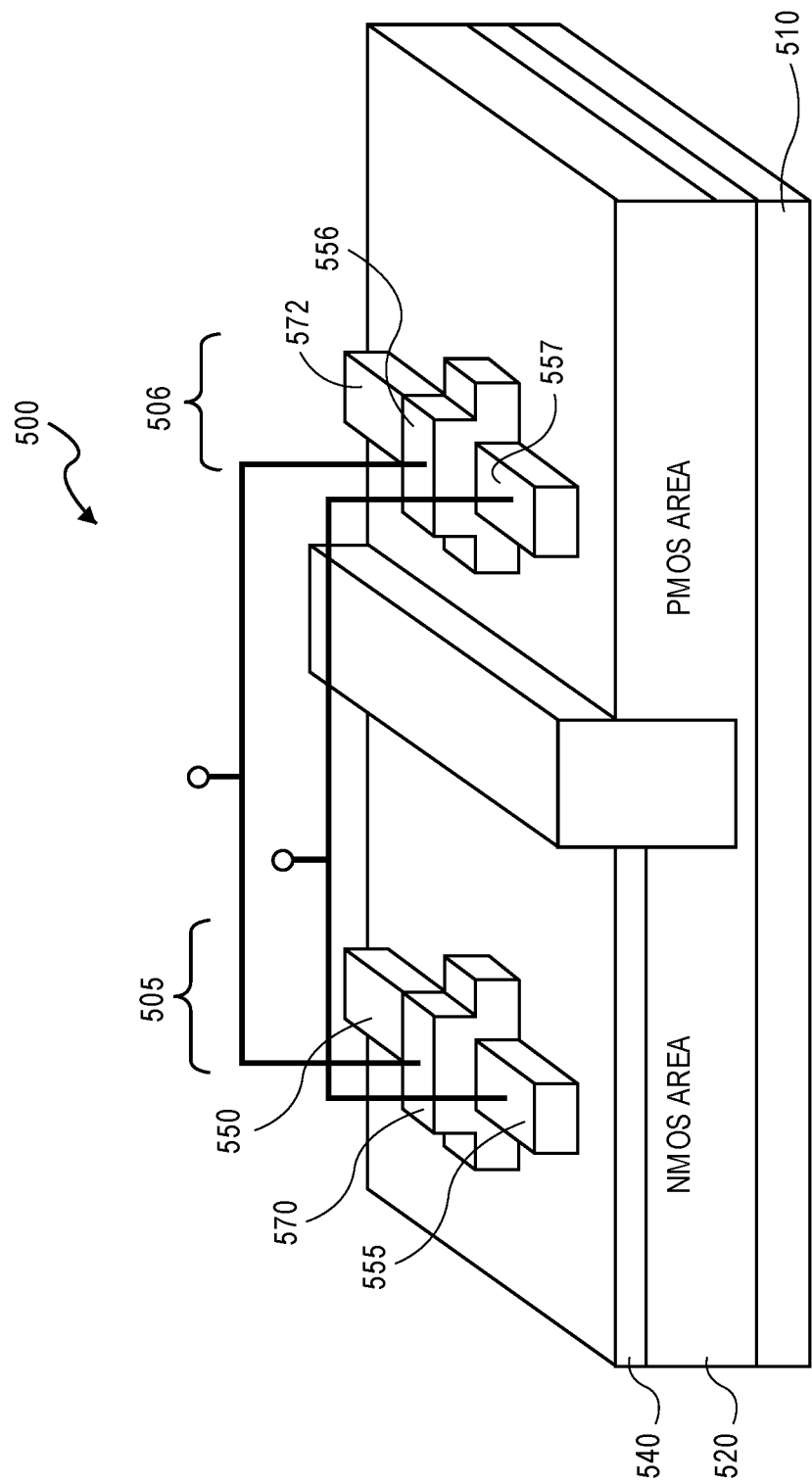
FIG. 14 shows a top side perspective schematic view of an embodiment of a CMOS inverter.

FIG. 14 shows a top, side perspective view of a CMOS inverter. Inverter 500 includes, in this embodiment, n-channel MOSFET 505 and p-channel MOSFET 506. Each of n-channel MOSFET 505 and p-channel MOSFET 506 is, in this embodiment, a non-planar device. It is appreciated that an inverter could also be formed using non-planar (e.g., multigate, nanowire) devices or a combination of different device types. In the embodiment illustrated in FIG. 14, each of n-channel MOSFET 505 and p-channel MOSFET 506 is formed on substrate 510. Substrate 510 is, for example, a single crystal silicon substrate or a silicon on insulator (SOI) substrate. N-channel MOSFET 505 and p-channel MOSFET 506 are separated by shallow trench isolation (STI) structure 550 of, for example, a dielectric material such as an oxide denoting in this illustration an NMOS area and a PMOS area. In NMOS area, an N-channel MOSFET device such as described above with reference to FIGS. 1-13 is formed. In NMOS area, overlying silicon substrate 510 is buffer layer 520 of, for example, a high band gap material or materials such as described above that has/have a positive CBO of more than 0.2 eV with respect to a channel material of N-channel MOSFET 505. Overlying buffer layer 520 in an NMOS area of the substrate is intrinsic layer 540 of, for example, InGaAs. Formed in the NMOS area is n-channel MOSFET 505 that includes gate electrode 570 and appropriately doped (e.g., silicon-doped) source 550 and drain 555 with a diffusion barrier layer disposed between each of the source and the drain and intrinsic layer 540. Gate electrode 570 is disposed on a channel region of the transistor that is formed in intrinsic layer 540. Gate electrode 570 is separated from the channel region by a gate dielectric disposed therebetween of, for example, silicon dioxide or a high-k dielectric material or a combination of the two.

P-channel MOSFET 506 in one embodiment is formed separately than N-channel MOSFET 505. Formed in PMOS area is p-channel MOSFET 506 includes gate electrode 572 and source 556 and drain 557 appropriately doped or constituting p-type material. In one embodiment, source 556 and drain 557 are a germanium material. Gate electrode 572 is disposed on a channel region of the transistor that is formed in intrinsic layer 542. Gate electrode 572 is separated from the channel by a gate dielectric such as silicon dioxide or a high-k dielectric material or a combination of the two. CMOS inverter 500 is formed by the connection of drain 555 of n-channel MOSFET 505 to drain 557 of p-channel MOSFET 506 and the connection of each gate electrode as illustrated.

Figure 15:
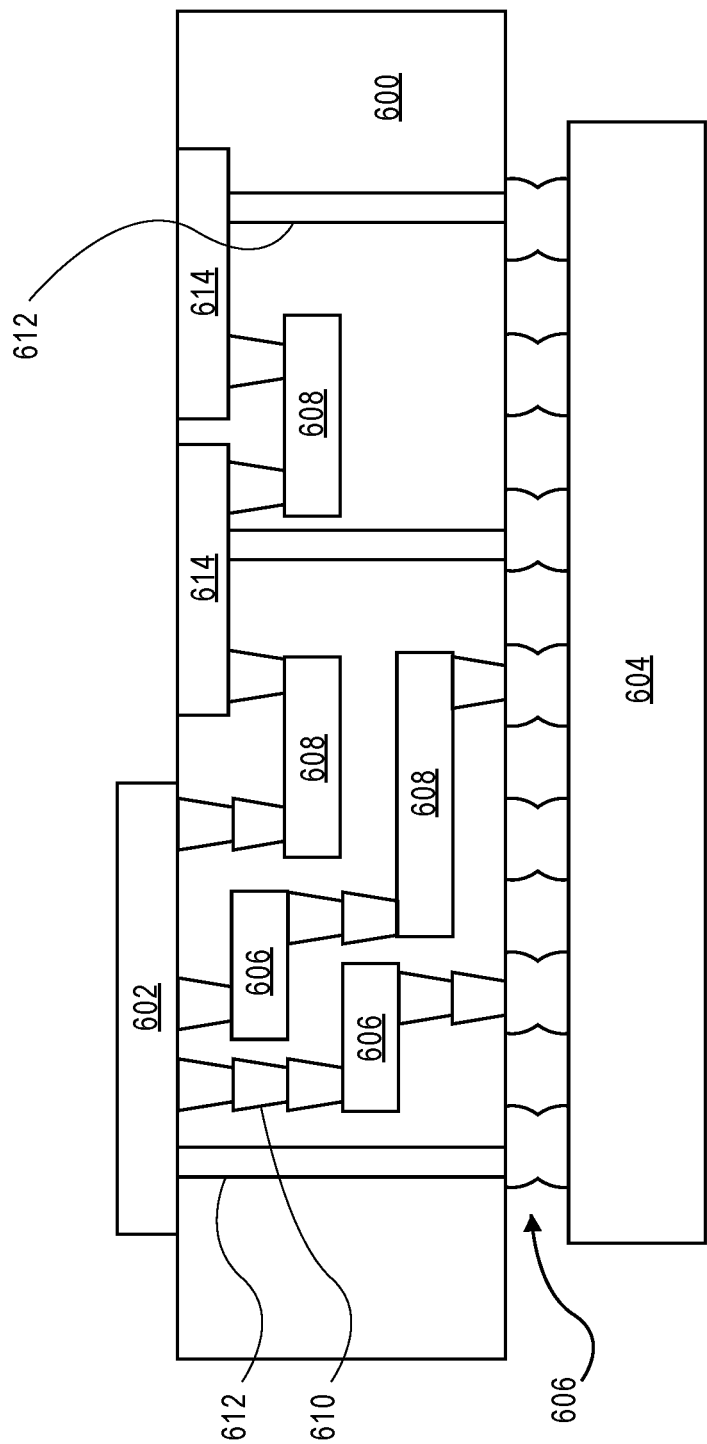
FIG. 15 is an interposer implementing one or more embodiments.

FIG. 15 illustrates interposer 600 that includes one or more embodiments. Interposer 600 is an intervening substrate used to bridge a first substrate 602 to second substrate 604. First substrate 602 may be, for instance, an integrated circuit die. Second substrate 604 may be, for instance, a memory module, a computer motherboard, or another integrated circuit die. Generally, the purpose of interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of interposer 600. In other embodiments, the first and second substrates 602/604 are attached to the same side of interposer 600. In further embodiments, three or more substrates are interconnected by way of interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 600.

In accordance with embodiments, apparatuses or processes disclosed herein may be used in the fabrication of interposer 600.

Figure 16:
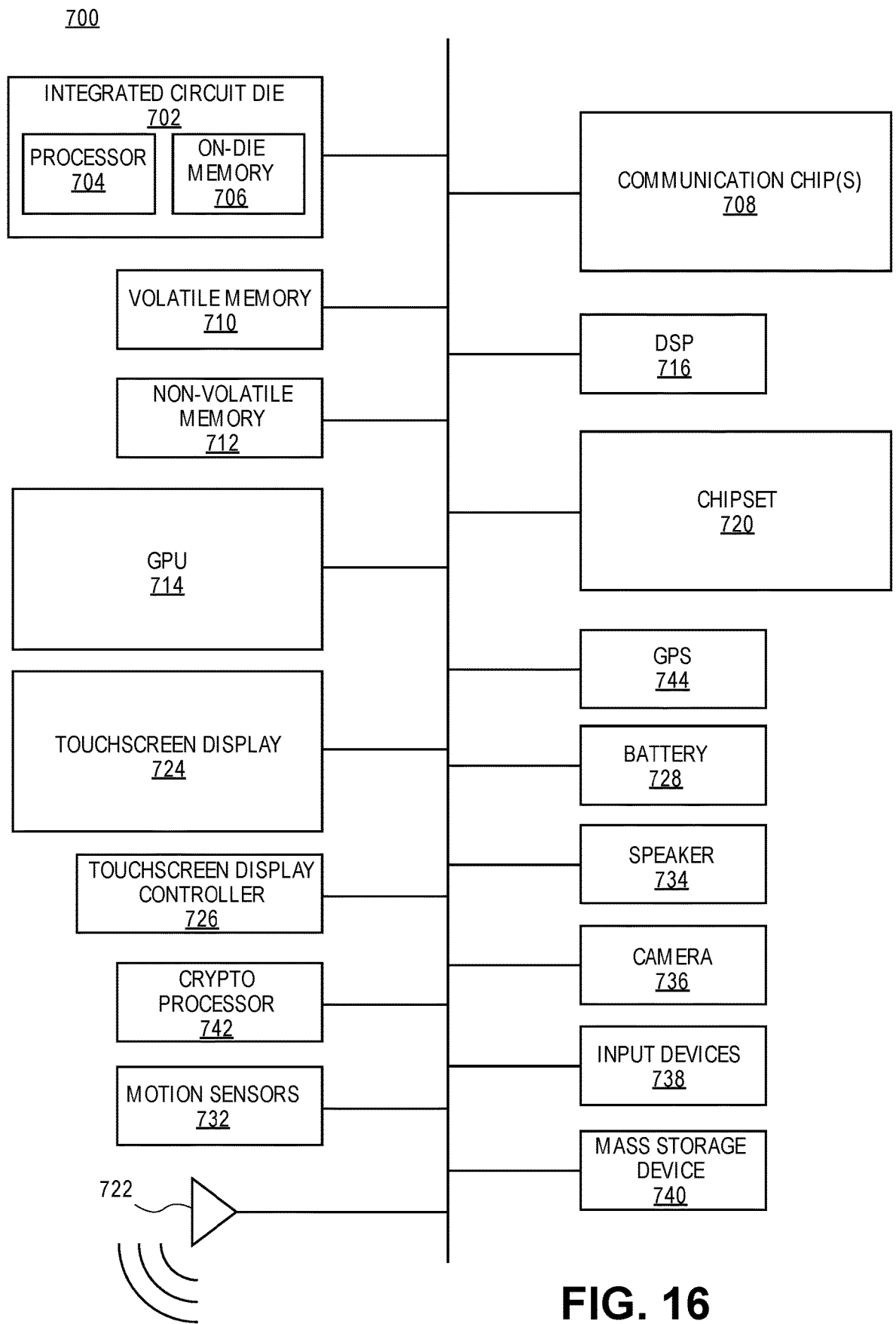
FIG. 16 illustrates an embodiment of a computing device.

FIG. 16 illustrates a computing device 700 in accordance with one embodiment. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a global positioning system (GPS) device 744, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The processor 704 of the computing device 700 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

The communication chip 708 may also include one or more devices, such as transistors, that are formed in accordance with embodiments.

In further embodiments, another component housed within the computing device 700 may contain one or more devices, such as transistors, that are formed in accordance with implementations.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

The following examples pertain to embodiments:

Example 1 is an apparatus including a substrate; a transistor device on the substrate including an intrinsic layer including a channel; a source material on a first side of the channel and a drain material on a second side of the channel; and a diffusion barrier between the intrinsic layer and each of the source material and the drain material, the diffusion barrier including a conduction band energy that is less than a conduction band energy of the channel and higher than a conduction band energy of the source material or the drain material.

In Example 2, the intrinsic layer of the apparatus of Example 1 includes a group III-V compound semiconductor material.

In Example 3, the diffusion barrier of the apparatus of Example 2 includes a dilute nitride alloy of the group III-V compound semiconductor of the intrinsic layer.

In Example 4, the intrinsic layer of the apparatus of Example 1 or 2 includes indium gallium arsenide (InGaAs) and the diffusion barrier includes $InGaAs_{1-y}N_y$, wherein y is less than 0.03.

In Example 5, the source material and the drain material of the apparatus of Example 2 include a group III-V compound semiconductor material.

In Example 6, the diffusion barrier of the apparatus of Example 4 includes a group III-V compound semiconductor nitride alloy.

In Example 7, the diffusion barrier of the apparatus of any of Examples 1-6 includes a pseudomorphic layer.

In Example 8, the transistor of the apparatus of any of Examples 1-7 includes an N-type transistor.

Example 9 is an apparatus including a transistor including an intrinsic layer including an NMOS channel and a source and a drain formed in the intrinsic layer and a diffusion barrier layer between the intrinsic layer and each of the source and the drain, wherein the diffusion barrier includes a nitride alloy of a material of the intrinsic layer.

In Example 10, the material of the intrinsic layer of the apparatus of Example 9 includes a group III-V compound semiconductor material.

In Example 11, the intrinsic layer of the apparatus of Example 10 includes indium gallium arsenide (InGaAs) and the diffusion barrier includes $InGaAs1-yNy$, wherein y is less than 0.03.

In Example 12, the source material and the drain material of the apparatus of Example 10 include a group III-V compound semiconductor material.

In Example 13, the diffusion barrier of the apparatus of Example 9 includes a pseudomorphic layer.

Example 14 is a method including defining an area of an intrinsic layer on a substrate for a channel of a transistor device and a source and a drain of the transistor device; forming a diffusion barrier layer in an area defined for a source and in an area defined for the drain, the diffusion barrier layer including a conduction band energy that is less than a conduction band energy of the channel and higher than a conduction band energy of one of the source material and the drain material; and forming a source on the diffusion barrier layer in the area defined for the source and forming a drain in the area defined for the drain.

In Example 15, the intrinsic layer in the method of Example 14 includes a group III-V compound semiconductor material.

In Example 16, the diffusion barrier layer in the method of Example 15 includes a nitride alloy of the group III-V compound semiconductor of the intrinsic layer.

In Example 17, the intrinsic layer in the method of Example 15 includes indium gallium arsenide (InGaAs) and the diffusion barrier includes $InGaAs_{1-y}N_y$, wherein y is less than 0.03.

In Example 18, forming the diffusion barrier in any of Examples 14-17 includes forming a pseudomorphic layer.

In Example 19, the method of Example 14 further includes forming a gate stack on the channel, the gate stack including a gate dielectric and a gate electrode wherein the gate dielectric of the method of Example 14 is disposed between the channel and the gate electrode.

In Example 20, forming a source and a drain in Example 19 include forming an N-type source and an N-type drain.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
    a substrate;
    a transistor device on the substrate comprising:
       an intrinsic layer comprising a channel;
       a source material on a first side of the channel and a drain material on a second side of the channel; and
       a diffusion barrier between the intrinsic layer and each of the source material and the drain material, the diffusion barrier comprising nitrogen and having a conduction band energy that is less than a conduction band energy of the channel and higher than a conduction band energy of the source material or the drain material.

2. The apparatus of claim 1, wherein the intrinsic layer comprises a group III-V compound semiconductor material.

3. The apparatus of claim 2, wherein the diffusion barrier comprises a dilute nitride alloy of the group III-V compound semiconductor of the intrinsic layer.

4. The apparatus of claim 1, wherein the intrinsic layer comprises indium gallium arsenide (InGaAs) and the diffusion barrier comprises $InGaAs_{1-y}N_y$, wherein y is less than 0.03.

5. The apparatus of claim 2, wherein the source material and the drain material comprise a group III-V compound semiconductor material.

6. The apparatus of claim 5, wherein the diffusion barrier comprises a group III-V compound semiconductor nitride alloy.

7. The apparatus of claim 1, wherein the diffusion barrier comprises a pseudomorphic layer.

8. The apparatus of claim 1, wherein the transistor comprises an N-type transistor.

9. An apparatus comprising:
    a transistor comprising an intrinsic layer comprising an NMOS channel and a source and a drain formed in the intrinsic layer and a diffusion barrier layer between the intrinsic layer and each of the source and the drain, wherein the diffusion barrier comprises a nitride alloy of a material of the intrinsic layer.

10. The apparatus of claim 9, wherein the material of the intrinsic layer comprises a group III-V compound semiconductor material.

11. The apparatus of claim 10, wherein the intrinsic layer comprises indium gallium arsenide (InGaAs) and the diffusion barrier comprises $InGaAs_{1-y}N_y$, wherein y is less than 0.03.

12. The apparatus of claim 10, wherein the source material and the drain material comprise a group III-V compound semiconductor material.

13. The apparatus of claim 9, wherein the diffusion barrier comprises a pseudomorphic layer.

14. A method comprising:
    defining an area of an intrinsic layer on a substrate for a channel of a transistor device and a source and a drain of the transistor device;
    forming a diffusion barrier layer in an area defined for a source and in an area defined for the drain, the diffusion barrier layer comprising nitrogen and having a conduction band energy that is less than a conduction band energy of the channel and higher than a conduction band energy of one of the source material and the drain material; and
    forming a source on the diffusion barrier layer in the area defined for the source and forming a drain in the area defined for the drain.

15. The method of claim 14, wherein the intrinsic layer comprises a group III-V compound semiconductor material.

16. The method of claim 15, wherein the diffusion barrier layer comprises a nitride alloy of the group III-V compound semiconductor of the intrinsic layer.

17. The method of claim 15, wherein the intrinsic layer comprises indium gallium arsenide (InGaAs) and the diffusion barrier comprises $InGaAs_{1-y}N_y$, wherein y is less than 0.03.

18. The method of claim 14, wherein forming the diffusion barrier comprises forming a pseudomorphic layer.

19. The method of claim 14, further comprising forming a gate stack on the channel, the gate stack comprising a gate dielectric and a gate electrode wherein the gate dielectric is disposed between the channel and the gate electrode.

20. The method of claim 19, wherein forming a source and a drain comprise forming an N-type source and an N-type drain.

21. An apparatus comprising:
    a substrate;
    a transistor device on the substrate comprising:
       an intrinsic layer comprising a channel;
       a source material on a first side of the channel and a drain material on a second side of the channel; and
       a diffusion barrier between the intrinsic layer and each of the source material and the drain material, the diffusion barrier comprising a conduction band energy that is less than a conduction band energy of the channel and higher than a conduction band energy of the source material or the drain material, wherein the diffusion barrier comprises a pseudomorphic layer.

* * * * *